United States Patent [19]

Martin et al.

[11] Patent Number: 4,848,533

[45] Date of Patent: Jul. 18, 1989

[54] APPARATUS FOR CONVEYING PANELS

[75] Inventors: Peter Martin, Basel; Hansjörg Singenberger, Arni; Viktor Lechleitner, Zürich, all of Switzerland

[73] Assignee: Ciba-Geigy Corporation, Ardsley, N.Y.

[21] Appl. No.: 243,181

[22] Filed: Sep. 14, 1988

Related U.S. Application Data

[63] Continuation of Ser. No. 926,062, Nov. 3, 1986, abandoned.

[30] Foreign Application Priority Data

Nov. 8, 1985 [CH] Switzerland .................. 4820/85

[51] Int. Cl.$^4$ .......................................... B65G 47/86
[52] U.S. Cl. ........................ 198/470.1; 198/473.1; 198/803.8; 198/803.9; 271/206; 271/277
[58] Field of Search ............ 198/470.1, 473.1, 803.8, 198/803.9, 803.11; 271/205, 206, 277

[56] References Cited

U.S. PATENT DOCUMENTS

| | | | |
|---|---|---|---|
| 1,079,218 | 11/1913 | Curtis | 198/803.8 |
| 1,357,387 | 11/1920 | Donnelly | 198/803.8 |
| 2,819,784 | 11/1958 | Brown, Jr. | 198/19 |
| 3,483,961 | 12/1969 | Girard | 198/803.8 |
| 3,877,564 | 4/1975 | Reist | 198/470.1 |
| 4,287,980 | 9/1981 | Montferme | 198/425 |

FOREIGN PATENT DOCUMENTS

| | | |
|---|---|---|
| 2134985 | 1/1973 | Fed. Rep. of Germany . |
| 2519610 | 11/1976 | Fed. Rep. of Germany . |
| 2439734 | 5/1980 | France . |
| 58-31811 | 5/1983 | Japan . |
| 1497766 | 1/1978 | United Kingdom . |

Primary Examiner—Joseph F. Valenza
Attorney, Agent, or Firm—Harry Falber

[57] ABSTRACT

A conveying apparatus for panels is equipped with two revolving endless conveyor belt members such as chains etc. The chains are connected with each other with successively arranged transverse organs such as cross bars. On each cross bar there are mounted displaceably with braking two panel-engaging devices comprising clamping springs for gripping and transferring panels from a charging to a discharging station past a random number of intermediate processing stations. Two pneumatically operable pusher members push the panel-engaging devices into contact with the lateral edges of an arriving panel and cause the clamping springs to grip the panel. At the discharging station, two separating pusher members of similar construction open the clamping springs and push the panel-engaging devices apart toward their terminal positions at opposite ends of their cross bar, thus setting the panel free to be discharged from the apparatus.

13 Claims, 8 Drawing Sheets

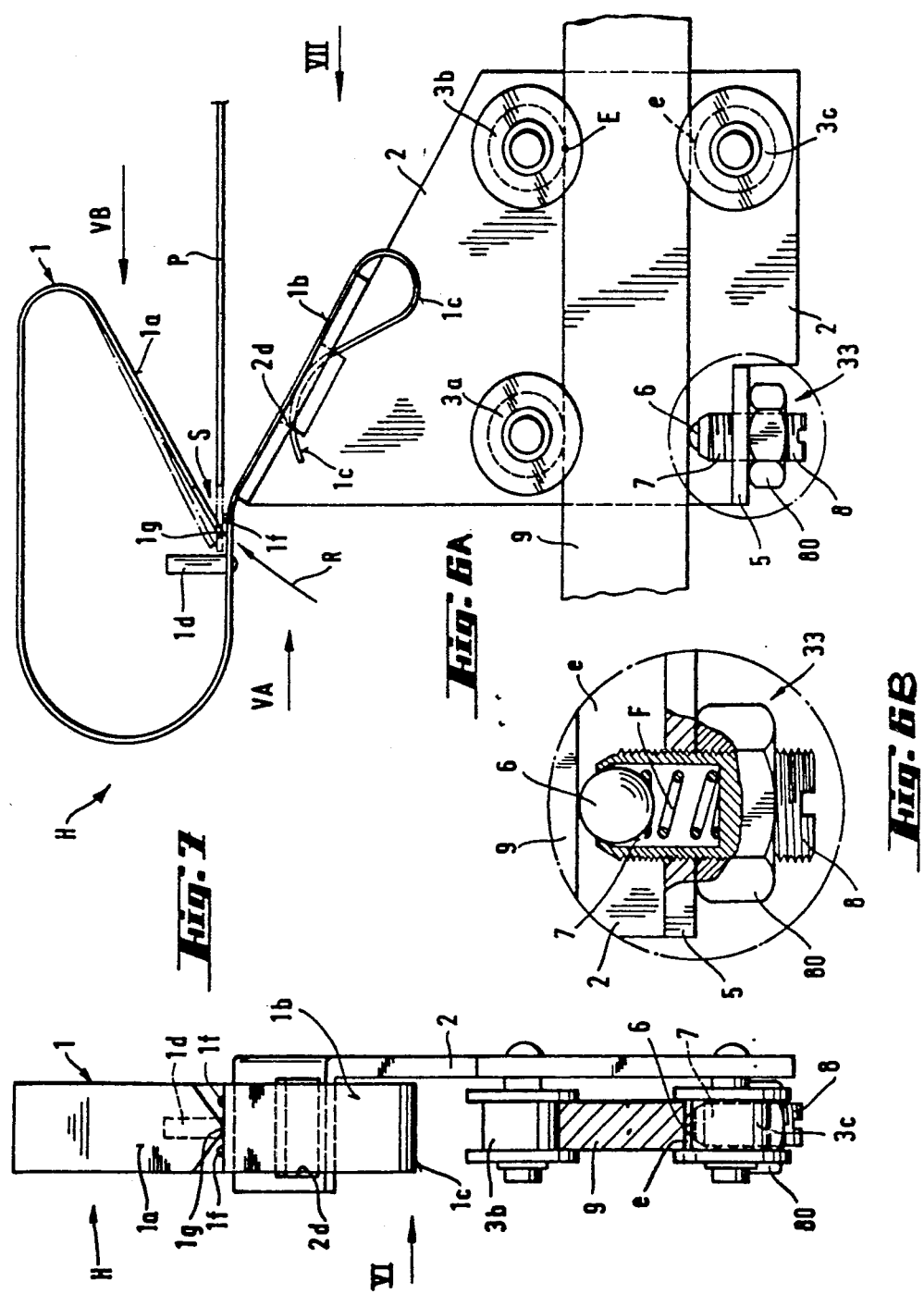

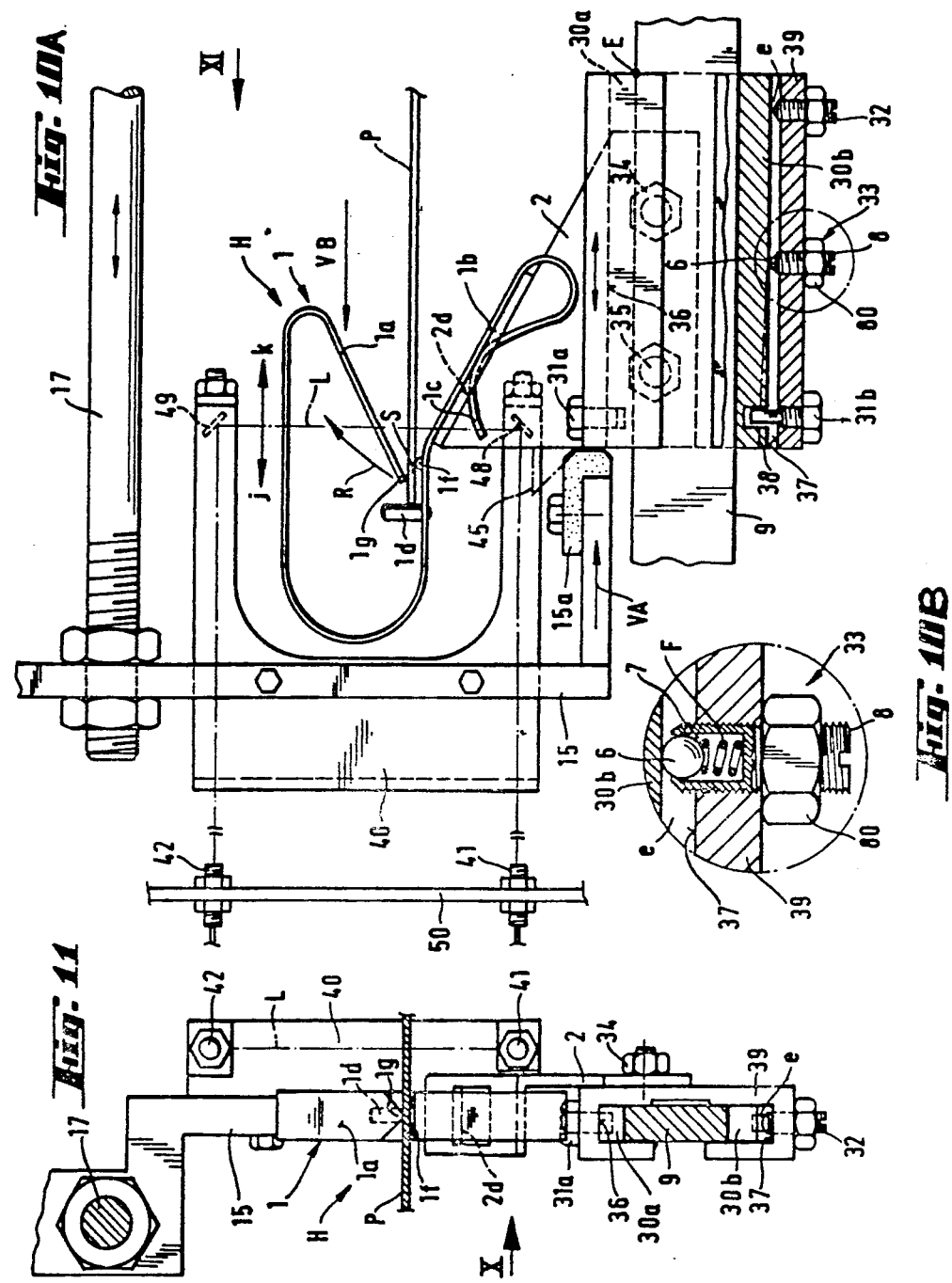

APPARATUS FOR CONVEYING PANELS

This application is a continuation of application Ser. No. 926,062, filed 11/3/86 now abandoned.

BACKGROUND OF THE INVENTION

This invention relates to apparatus for conveying panels; more in particular the apparatus according to the invention is a conveyor belt destined to convey in a longitudinal transfer direction electric circuit panels and comprises two endless conveyor belt members revolving spaced from, and in parallel with each other, which endless members can consist of belts, ropes, chains or the like; a charging station, a discharging station, and a random number of working stations therebetween, through which the panels are to be transferred by the conveyor belt; and panel-engaging devices associated with the endless conveyor belt members and spaced from each other in sequence at determined intervals which engaging means are adapted for gripping successively rims of the panels, on opposite sides thereof, at the charging station, and thus holding the gripped panels while transferring them past the working stations to the discharging station and releasing the panels again in the latter station.

The conveyance of panels having sensitive surfaces always presents a problem. This is particularly true in the case of freshly coated circuit panels which are to be transferred from a coating station to a drying station. The panels are first provided with conductive paths, whereupon a coat of protective varnish is applied to one panel surface. The varnish layer is then dried, exposed to light and the lighted areas are developed, whereby the conductive path is exposed at certain points which can then be electrically contacted.

In order to coat the panel, it must be cleaned, preheated and a layer of the protective varnish applied to one side thereof; the varnish solvent is then evaporated (e.g. by passing an air stream past the coated surface) and finally the coated panel is transferred to an oven for drying. The same procedure of pre-heating, coating, evaporation of solvent by ventilating air, and drying is then repeated to a varnish coating on the opposite surface of the panel. The panel is then again exposed with its other surface, developed and finally dried in the oven.

The automatic transfer of the circuit panels on the conveyor apparatus is problematic particularly when the second surface of the panel is to be coated, and most particularly during the heating phase. Heating does, of course, greatly soften the varnish and renders it particularly sensitive to touch, e.g. by mechanical parts of the apparatus. Conventional conveying apparatus such as conveyor belts supporting the panels would injure the varnish layer to an inadmissible degree, leading to deformation of the supported areas and to contamination with dirt, dust, grease and the like.

For this reason, a known conveying apparatus comprises two conveyor belts revolving in parallel in such position that their cross sections form together a V pointing downwardly, so that the panels being transferred only contact the upper marginal zones of the V. However, particularly these panels tend to bend and thus come to rest on broader zones of the two conveyor belts, thereby damaging the varnish layer on the underside of the panel and rendering it unfit for its protective purpose.

Therefore, conveyor apparatus were developed which comprise gripping means mounted on the conveyor chains and adapted for clamping-in the panel margins. These gripping means comprise a relatively complicated automatic clamping mechanism. Particularly, when panels of varying width are to be transferred, the relative position of the chains bearing the gripping means must be re-adjusted each time a panel of different width, transverse to the direction of transfer, is to be taken up by the conveyor, thus interrupting each time the work process.

Further problems are caused by panels having a certain twist, i.e. where the panel surface does not extend in a straight horizontal plane. These panels must be turned by a specially provided guiding system so that they can be inserted in the gripping means of which those positioned on opposite belt members face each other, and those adjacent each other on one and the same belt member are also located, in a common straight flat plane. Moreover, a safe grip of these known gripping means is not guaranteed in the manner independently of the weight and thickness of the panels. In this connection, it must be taken into account that the thickness of the panels and their flexibility will continuously vary as the temperature of the panel changes.

Finally, it should be mentioned that gripping means of known construction tend to become clogged by softened varnish and to bind after several runs of panels therethrough.

OBJECT AND SUMMARY OF THE INVENTION

It is an object of the invention to provide a conveyor apparatus of the initially described kind which avoids the last-described drawbacks of the known gripping means and affords the safe conveyance of surface-sensitive panels independent of their size, positioning and thickness, while optimally conserving an immaculate condition of the treated surface of the panel being transferred.

These and other objects that will become apparent from the further description of the conveyor apparatus according to the invention hereinafter, are attained in an initially described kind of apparatus which comprises, in accordance with the invention, a plurality of transverse organs extending across the two spacedly and parallelly arranged endless conveyor belt members, which organs extend at right angle to the direction of conveying movement of the conveyor belt, each of which organs is adapted to support two of the panel-engaging devices, one thereof associated with the right hand conveyor belt member and the other one associated with the left hand conveyor belt member, looking in the direction of conveyor belt movement, the two panel-engaging devices being displaceably borne on the transverse organ for movement thereon toward and away from each other, and the panel-engaging devices comprise brake means for braking the said devices thereon up to completely arresting them in defined positions;

approaching means associated with the charging station and adapted to move the two devices on the same transverse organ, upon reaching the charging station, inwardly toward each other along the transverse organ to bring them into gripping engagement with the two rims extending generally longitudinally on opposite sides of a panel, and separating means associated with the discharging station and adapted for opening and moving outwardly, away from each other, the two panel-engaging devices on the same transverse organ upon reaching the discharging station, thereby releasing the gripped panel.

The plane in which the conveyor belt movss during a horizontally extending, upper reach thereof and which extends through the two conveyor belt members is referred to hereinafter as the horizontal conveyor plane. The direction of conveying movement is designated as the longitudinal direction. The transverse organs extend in a transverse direction, preferably a right angle to that horizontal direction, but in a second plane parallel with and above the horizontal conveyor plane when in the above-mentioned reach. The panel-gripping and holding devices are mounted on these transverse organs, and transfer the panels, which are gripped and held by them, in longitudinal direction in a transfer plane which is parallel with and above the aforesaid second plane, as far as the above-mentioned upper conveyor belt reach is concerned.

The approaching and separating means mentioned above can be located in suitable association with the panel-engaging devices and transverse organs; of course, they do not interfere with the movement of these parts. Inward or approaching displacement of the panel-engaging devices means that they are moved toward each other transversely to the longitudinal direction, on the same transverse organ, and outward or separating displacement thereof means that these devices are moved apart on the same transverse organ.

Inward tilting of a panel-engaging device means that the part thereof which faces straight across toward the other panel-engaging device on the same transverse organ while in unloaded or straightened condition is tilted slightly inwardly toward the other device from its untilted and straight, upright position toward the horizontal conveyor plane therebelow, prior to its travelling through the above-mentioned upper reach.

Preferred embodiments of the conveyor apparatus according to the invention possess at least one of the following features while a most preferred embodiment possesses the first to eleventh inclusive of the features listed below as well as the 14th feature. In embodiment of the apparatus according to the invention possessing the first to twelfth preferred feature inclusive, as well as the thirteenth instead of the fourteenth feature is the next-preferred one.

The preferred features are:

(1) Each of the panel-engaging (i.e., the panel-gripping and holding) devices according to the invention comprises a restoring spring and is tiltable in inward direction about a swivel axis, against the bias of the restoring spring, whenever the device is being pushed into contact with a panel rim, by the approaching means, e.g., a pusher member; and the restoring spring is adapted for returning the tilted panel-engaging device to its untilted position, whereby a straightening and stretching pull, transverse to the aforesaid longitudinal direction, is exerted on a panel gripped between a pair of the devices being returned to untilted position on their common transverse organ.

(2) The approaching means at the charging station comprise a set of pusher members adapted for pushing a pair of the panel-engaging devices on their common transverse organ inward into position for gripping a panel, and first drive means stationary in the charging station are adapted for actuating the set of pusher members; and the separating means comprise a set of separating members adapted for pushing a pair of the panel-engaging devices on a common transverse organ outward while at the same time causing the devices to open and to release a panel gripped by them; second drive means stationary in the discharging station are adapted for acuating the set of separating members. The set of pusher members and the set of separating members are both arranged in the same manner, i.e., above the transfer plane, as far as the horizontal upper reach is concerned, and so are the respective drive means.

(3) As a pair of panel-engaging devices on a common transverse organ enters the charging station, the set of pusher members therein at the beginning of the upper reach is caused to engage the said devices at a level above their swivel axes and push them inward, while the braking force of the restoring spring in each device is so dimensioned as to be smaller than the displacing force applied by the pusher members to the devices, or by the separating members at the discharging station to a pair of devices, when displacing them inwardly or outwardly, respectively, on their common transverse organ; however, the braking force of the restoring spring is stronger than a displacing force exercized by a panel due to its weight on a pair of such devices gripping that panel.

(4) Each panel-engaging device of a pair thereof on a common transverse organ comprises a clamping spring and each clamping spring comprises two clamping legs whose cross-sectional configuration, in a plane normal to the said longitudinal direction, is a V whose pointed end is directed outwardly and whose opposite, open end is directed inwardly, straigth across toward the open end of the V formed mirror-symmetrically by the V-legs of the clamping spring in the opposite device of the said pair; and the two V-legs are in free contact with each other at the pointed V-end, the upper one of the two V-legs being urged with a bias inherent in the clamping spring against an upper zone of the other V-leg, which is the lower one; the upper V-leg is adapted to be lifted off the lower V-leg against the said inherent bias, a slot being thereby formed between them, by the rim of a penetrating panel, when the two devices on the common transverse organ are pushed inward with such panel.

(5) The clamping spring and its two V-legs is preferably constituted by a correspondingly shaped blade spring, as one piece.

(6) The two separating members, being of similar shape as the two pusher members, forming the separating set at the discharging station, are adapted to engage the pair of panel-engaging devices arriving at that station with a panel gripped by them, by each separating member contacting the outside of the upper V-leg of the clamping spring in the respective device above the gripped panel, and, when beginning to push the device in outward direction, the separating member will lift the upper V-leg, against the inherent bias thereof, off the panel; the pushing force exerted by the separating member on the panel-engaging device must be larger than the inherent bias of the upper V-leg plus the braking force of the retaining spring in the device; the upper V-leg is thus lifted away from the lower one and off the panel which is thereby released, while the two devices are pushed outwardly to terminal positions at the ends of their common transverse organ.

(7) Each panel-engaging device is mounted on its respective transverse organ with a small play; this play enables the device to be tilted inward by the approaching means, i.e., the respective pusher member, which urges an outward portion of the device upwardly off the transverse organ, as far as the play allows, and against the bias of the restoring spring in the device; this restoring spring brakes the device on the transverse organ and simultaneously returns the device to its untilted position as soon as the inward push and lifting action of the pusher member ceases.

(8) The distance between the swivel axis of a panel-engaging device and a transfer plane in which the panel gripped by a pair of devices moves, and the distance of the swivel axis from the lifting end of the restoring spring constitutes a lever system such, and the restoring spring is arranged in a position such in the respective device, that the tilting amplitude of the slot about the swivel axis is larger than, and may be a multiple of, the stroke which the restoring spring carries out when returning the respective panel-engaging device to untilted position on the transverse organ.

(9) The clamping spring of each panel-engaging device comprises abutting means such as a pin or stud, mounted on the clamping spring opposite and outwardly of the slot being opened between the inner ends of the V-legs when the rim of a panel is engaged by the device, whereby the penetrating edge of the panel can abut against the abutting means.

(10) At least the lower one of the V-legs of the clamping spring bears upwardly protruding nipple means or the like projections, in the vicinity of the slot, while the upper V-leg can have a pointed free end, whereby the surface of a panel whose rim is introduced into the slot will have its sensitive surfaces contacted only in small point-like areas.

(11) Each pusher member of the charging station can be equipped with a light barrier adapted for scanning the depth of penetration of a panel rim zone into the slot between the V-legs, of the clamping spring in a device, and can comprise control means adapted for stopping and reversing the above-mentioned first drive means, as soon as the light barrier detects a panel rim having penetrated into the slot by a determined length.

(12) Each panel-engaging device comprises a carrier body having a top region and recess means therein for engaging an upper and a lower face of the transverse organ bearing it, with play, and in a horizontally displaceable manner relative thereto, and the lower V-leg of the clamping spring in the device comprises a prolongation which is firmly mounted in the upper region of the carrier body; and the restoring spring is adjustable and lodges in the carrier body in a manner adapted for engaging brakingly the lower face of the transverse organ in the recess means of the carrier body.

(13) The carrier body of each panel-engaging device comprises further movable supporting means adapted for supporting it on a transverse organ, and such supporting means can be rotatable members of the roller and wheel type.

(14) In a most preferred embodiment of the apparatus according to the invention, the carrier body of the panel-engaging device comprises supporting means which are constituted by a pair of braking and sliding runners, the said recess means in the carrier body form a cage having beside a main passage for receiving the transverse organ therein, a first groove located above and a second groove located below that passage and opening in the same; one of the runners is lodged in the first, upper groove in a position such as to rest upon the upper face of a transverse organ, e.g., a cross bar, inserted in the passage, and the other runner is lodged in the said second, lower groove in a position such as to rest with play underneath the lower face of the transverse organ; and the restoring spring is mounted in the part of the cage which forms the bottom of the second groove in a manner such as to penetrate into that second groove, thereby being adapted for exerting adjustable pressure on the lower runner therein, urging it into braking contact with the lower face of the transverse organ while maintaining play between the lower runner and the bottom of the second groove, and simultaneously urging the upper runner in the first groove into braking contact with the upper face of the transverse organ.

In further aspects, the invention comprises the novel panel-engaging device having the above-described features, as well as a novel combination of a pair of such panel-engaging devices and a transverse organ.

BRIEF DESCRIPTION OF THE DRAWINGS

Further objects and advantages of the invention will become apparent from the following more detailed description thereof in connection with the accompanying drawings in which

FIG. 6A shows a first embodiment of a panel-engaging device and its support on a transverse organ of the embodiment of the apparatus according to the invention shown in FIGS. 1 to 5, in a schematic frontal view;

FIG. 7 is a cross-sectional view of the first embodiment of the panel-engaging device, taken in a plane indicated by VII—VII in FIG. 6A;

FIG. 8A shows in sideview a second embodiment of the panel-engaging device according to the invention;

FIG. 9 is a cross-sectional view of the second device embodiment taken in a plane indicated by IX—IX in FIG. 8A;

FIG. 10A shows in side view a third embodiment of the panel-engaging device, resembling largely the embodiment shown in FIGS. 8A and 9, and FIG. 11 is a cross-sectional view taken in a plane indicated by XI—XI in FIG. 10A.

Figures 8A, 8B, 9:
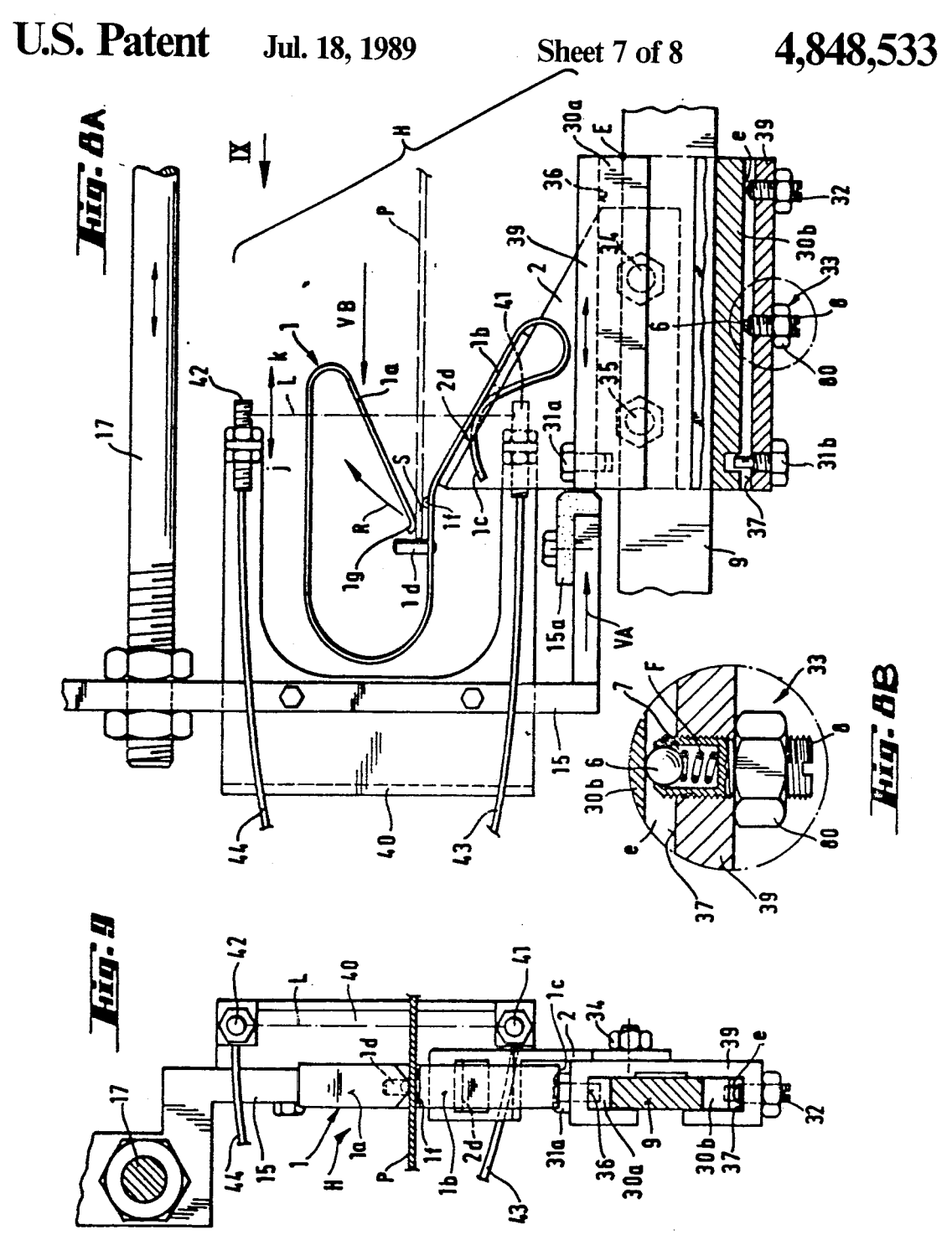
Figure 1:
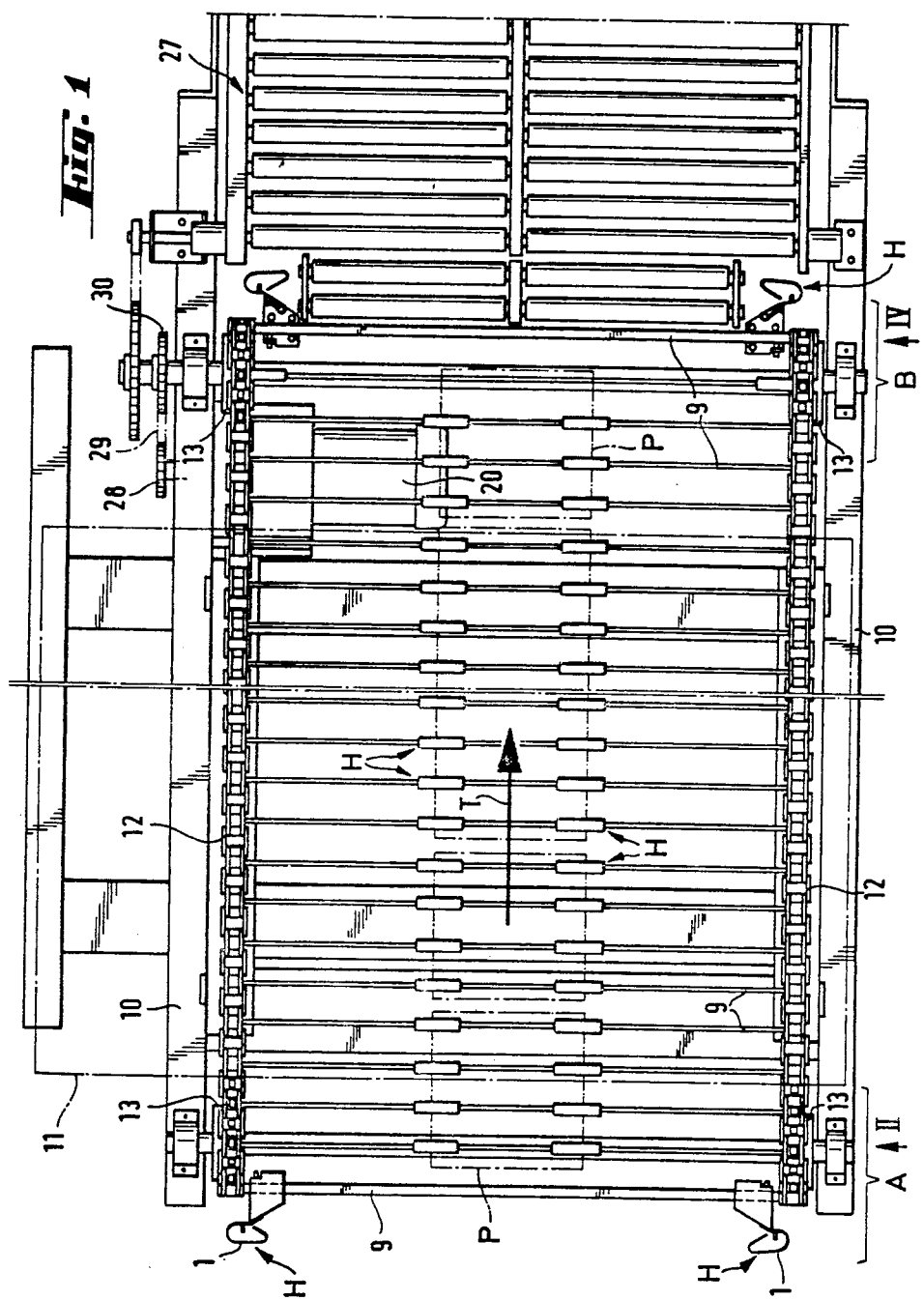
FIG. 1 shows schematically and in top view a preferred embodiment of the apparatus according to the invention comprising a charging station and a discharging station with the panel-engaging (gripping and holding) devices being only generally indicated.

Small encircled regions containing a restoring spring as illustrated in FIGS. 6A, 8A and 10A, respectively, are shown on a larger scale in more detail in cross-section in subsidiary views FIGS. 6B, 8B and 10B, respectively, adjacent these figures.

DETAILED DESCRIPTION OF THE EMBODIMENTS SHOWN IN THE DRAWINGS

Figure 5:
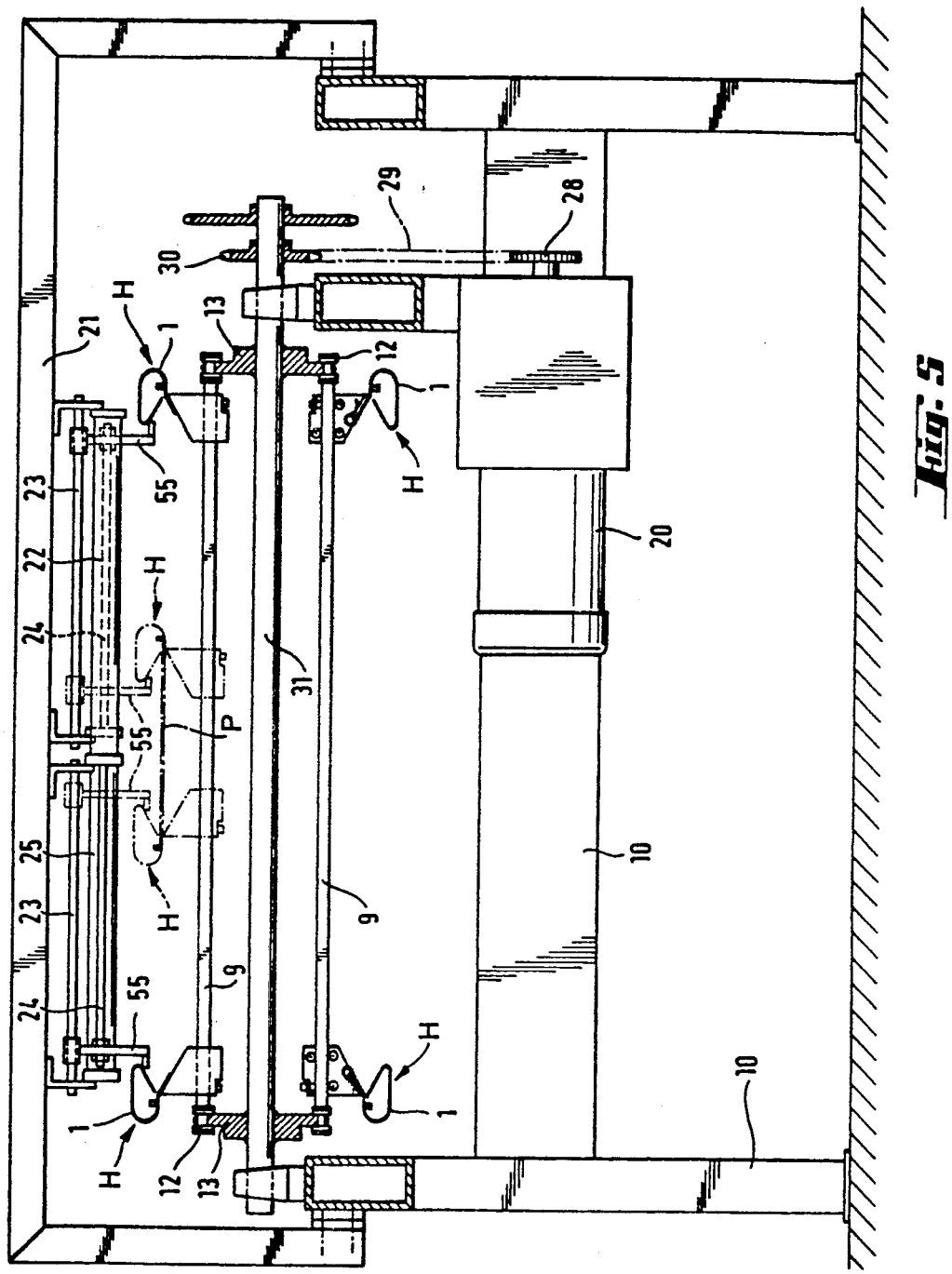
FIG. 5 is a rear end view of the same embodiment as shown in the preceding figures, taken in the direction indicated by an arrow V in FIG. 4.

The conveying apparatus embodiment shown in FIGS. 1 to 5 comprises conveyor belt members 12 revolving in the direction of an arrow T. A motor 20 drives the belt members 12 via a transmission comprising pulleys 28 and 39 and a transmission member 29 being a rope, belt or chain. The pulley 39 is seated firmly on a driven shaft 31 bearing deflector rollers 13 (FIG. 5). On the belt members 12 there are attached in regular intervals cross bars 9 constituting transverse organs. On each such cross bar 9 there are displaceably mounted panel-engaging devices H which serve to grip and hold panels during their transfer through the apparatus.

The conveying apparatus shown comprises a charging station A (FIGS. 2 and 3) at which the panels are gripped by the panel-engaging devices H on the next-succeeding cross bar 9 in the sequence thereof being deflected from upward to forward movement, in the direction of the arrow T, about the deflecting rollers 13 (FIG. 2) and transfered horizontally past a processing station (under a covering hood 11, e.g. a drying oven) to a discharging station B (FIGS. 4 and 5) where the panel-engaging devices H are automatically opened and release the treated panels which can then be transported away by means of a roller train 27 (FIGS. 1 and 5).

Before explaining more in detail the operation of the conveyor apparatus shown in FIGS. 1 to 5, there shall first be described the panel-engaging devices H and their support on the transverse organs, i.e. cross bars 9, in connection with FIGS. 6A and 7 illustrating a first embodiment, FIGS. 8A and 9, illustrating a second embodiment and FIGS. 10A and 11 illustrating a third embodiment of these devices.

In the embodiment of a panel-engaging device and support therefor, illustrated in FIGS. 6A and 7, each such device H comprises a clamping spring 1 which is mounted by means of spring parts 1b and 1c on a carrier body 2.

The clamping spring 1 has been represented as a blade spring. It is shaped in a manner such that its lateral view (direction of the arrow T in FIG. 1) comprises an open V whose legs 1a and 1b have a contact line, appearing in cross-section as a point in FIG. 6A, at which the upper spring leg 1a rests on the lower spring leg 1b when in closed position, whereas lifting the inner, downward free end of the spring leg 1a, at the tip of the V, will open resiliently, against the bias of the spring, a gap or slot S between the two spring legs 1a and 1b into which slot S a panel P can enter. At its upper region the upper, inwardly and upwardly ascending V-forming leg 1a is bent upward and the clamping spring 1 then continues outwardly beyond the region of the V-tip or slot S and in an arc downwardly and further on inwardly toward the V-tip or slot S where it merges with the lower V-forming leg 1b. This lower leg 1b extends inwardly and downwardly, relative to the panel transfer plane which extends through the slot S, and merges at its lower end into an arcuate prolongation 1c which is bent outwardly and upwardly and fits into a corresponding recess 2d in the upper, inwardly slanted end wall of the carrier body 2, firmly connecting the clamping spring 1 with the carrier body 2. Outwardly of, and at a short distance from, the slot S the inwardly extending horizontal part of the clamping spring 1 bears an upwardly protruding pin or rib 1d as an abutting element against which the edge of the gripped rim zone of a panel P can abut as indicated in dashed outline in FIG. 6A.

The edge of the inner end of the upper leg 1a can be shaped to be pointed downwardly to form a tip 1g (FIG. 7) which thus contacts a panel P held by the clamping spring 1, in a very point-like small contact area. In the region of the slot S, where the lower horizontally extending part of the clamping spring 1 merges with the lower spring leg 1b, the clamping spring 1 bears upwardly protruding nipples 1f on which the panel P can slide with a minimum contact of its underside surface with the spring 1 through the slot 1 into an abutting position at the pin 1d; the nipples 1f of the lower leg 1b together with the tip 1g of the upper leg 1a thus hold a panel safely in an improved manner between them while avoiding by contact in only three points any damage to the surfaces on the upper side and underside of the horizontally transferred panel.

The inner, lower end edge of the V-forming leg 1a of the clamping spring 1 can either be of pointed configuration ending in a tip 1g as in the first and third embodiments illustrated in FIGS. 7 and 11, respectively, or, in the second embodiment, that edge of the leg 1a can be crimped outwardly of the slot S and upwardly whereby there results a curved contact line with the upside panel surface therebelow, as shown in FIG. 8A.

In the first embodiment of a panel-gripping and -holding device which is illustrated in FIGS. 6A and 7, the carrier body 2 is displaceably secured on the cross bar 9 by means of two upper support rollers 3a and 3b, the former outwardly and the latter inwardly located in the carrier body 2, and a lower guide roller 3c. As shown in FIG. 7 and the subsidiary enlarged view of a region of FIG. 6B the spacing between the rolling contact surface of the upper support roller 3b and that of the lower support roller 3c is slightly larger than the height of the cross bar 9 (FIG. 2) so that there is play between the roller assembly 3a–3b–3c and the cross bar 9. A rectangular niche is formed at the bottom end of the carrier body 2 by an angle iron 5 which bears a spring mechanism comprising a compression spring F inserted in a cylinder 7 set adjustably as to height in the angle iron 5 and containing in its upper open end a ball 6 which is urged by the spring F into braking contact with the underside of the cross bar 9. The bias of the spring F thus pulls the rolling contact faces of the upper support rollers 3a and 3b into braking contact with the upper face of the cross bar 9, while at the same time maintaining a play e between the underside face of the cross bar 9 and the upper zone of the rolling face of the lower supporting roller 3c and the upper rim of the cylinder 7.

The pressure of the spring F against the underside of the cross bar 9 via the belt 6 is adjustable by means of an adjusting screw 8. A fine adjustment of the braking force exerted by the spring F on the cross bar 9 is achieved by screwing the externally threaded cylinder 7 upward or downward in an internally threaded opening in the angle iron 5 of the carrier body 2. The cylinder 7 is fixed in the chosen position by means of a lock nut 80. Owing to this arrangement and a sufficient play of the roller support of the carrier body 2, the clamping spring 1 can be tilted inwardly, in clockwise direction, away from the position shown in FIG. 6A, due to pressure of a pusher member 15, being part of the approaching means, which acts in the direction of the arrow VA at a contact level somewhat above that of the slot S, i.e., above the transfer plane. This tilting pressure is transmitted to the carrier body 2 which lifts off upwardly with its upper outward end portion, outwardly of the axle of the support roller 3a, about a swivel axis E which is located at the contact zone of the rolling contact surface of the inward upper support roller 3b with the upper face of the cross bar 9. The amplitude of this clockwise tilting of the carrier body 2 and the clamping spring 1 thereon is limited by the outward end of angle iron 5, or the upper rim of the cylinder 7, abutting against the underside of the cross bar in the rectangular recess, while the upwardly tilting angle iron 5 compresses the spring F via the ball 6 being urged toward the interior of the cylinder 7 and thereby generating a restoring bias of the spring F. Of course, the swivel axis E extends at right angle to the longitudinal extension of the cross bar 9 and parallel with the longitudinal panel transfer direction T.

The proportion of the distances, acting as lever arms, of the swivel axis E from the upper rim of the cylinder 7, or the outward end of the angle iron 5, as the case may be, on the one hand, and of the swivel axis E from the slot S, on the other hand is such that the tilting arc traveled by the slot S is significantly larger than the arc traveled by the upper rim of the cylinder 7 or the outward end of the angle arm 5 from its untilted position to its abutment with the underside of the cross bar 9. The arc can be a multiple of e.

The spring-biassed ball 6 acts as a brake against displacement of the support body 2 along the cross bar 9, i.e., in a direction transverse to the longitudinal panel-transporting direction T. In lieu of the ball 6 there can also be provided a brake shoe or the like element. The spring F thus serves as a braking element as well as a restoring element for the tilting mechanism.

The embodiments illustrated in FIGS. 8A and 9, as well as in FIGS. 10A and 11 are both distinguished from the embodiment shown in FIGS. 6 and 7 by the means by which the carrier body 2 is supported on the cross bar 9. This support is effected by means of an upper sliding runner 30a, sliding on the flat top end face, and a lower sliding runner 30b, sliding on the flat bottom end face, respectively, of the cross bar 9. The runners lodged in grooves 36 and 37 opening downward and upward, respectively, in a runner cage member 30 which is open laterally and is fastened firmly by means of screw bolts 34 and 35 on the sidewall of the carrier body 2 to rest securely in the grooves 36,37 formed between upper and lower guiding ledges being molded integral with the cage member 30. Holding screws 31a and 31b secure the sliding runners 30a and 30b, respectively, against longitudinal displacement relative to the grooves of the carrier body 2 in which they are lodged, i.e. transverse to the longitudinal panel-transfer direction T. The lower runner 30b rests in the groove 37 on two spacers in the bottom wall of that groove, one of which spacers is constituted by a setting screw 32 and the other is constituted by an adjustable ball-and-spring unit 33 consisting of the same parts 6, 7, 8, 80 and F that have been described in detail in connection with the enlarged subsidiary figure of FIG. 6B. This spring mechanism enables fine adjustment of the contact height of the ball 6 as well as the bias of the spring F, and, by means of the setting screw 32, also the amount of play between the lower sliding runner 30b and the bottom end face of the cross bar 9. This play can also be altered easily by exchanging the upper, or the lower, sliding runner 30a, 30b, or both runners, for vertically thinner or thicker ones. The carrier body 2 and together therewith the panel-gripping slot S are therefore tiltable clockwise inwardly and clockwise in the direction of the arrow D to a limited extent against the bias of the spring F acting as a restoring spring, with the swivel axis E of the tilting movement being located at the inward lower edge of the upper runner 30a supported on the top face of the upper end of the lower holding of the cross bar 9 and extends in the longitudinal transfer direction T, i.e., at right angle to the transverse direction in which the cross bar 9 extends. In a manner similar to that explained in connection with FIG. 6A, the swivel amplitude of the panel-gripping slot S is larger than that of the contact point between the cylinder 7 and the underside of the lower runner 30b. The spring F, compressed by the tilting movement, urges the runner 30b more or less strongly against the underside of the cross bar 9, thus generating the required braking force.

In the FIGS. 6A through 11, only the "left-hand" panel-engaging devices, looking in the longitudinal direction of panel travel T, have been illustrated. The "right-hand" devices are of mirror-symmetrical construction and functions. Thus, an inwardly directed clockwise tilting movement of the left-hand panel-engaging device H on the cross bar 9 will correspond to an inwardly directed counter-clockwise tilting movement of the right-hand device H on the same crossbar.

In the embodiments shown in FIGS. 6A to 11, the panel-engaging devices H and their carrier bodies 2 can be displaced against a braking force and limitedly tilted, against a restoring bias of a spring F, relative to the cross bars 9 constituting transverse organs in the conveyor apparatus according to the invention. This arrangement enables a relatively simple construction which is safe in operation.

In principle, the displacement with braking, and the tilting and restoring functions can also be separated from each other, e.g. by providing the carrier body itself with articulation and with a restoring spring.

The objects and advantages attained with panel-engaging devices which are tiltable in a limited manner hereinbefore shall be explained in detail further below.

There shall, however, be described beforehand the mechanism for approaching the two panel-engaging devices on one and the same transverse organ, on the one hand, and the mechanism for moving such devices apart from each other on the same transverse organ, on the other hand.

Figure 2:
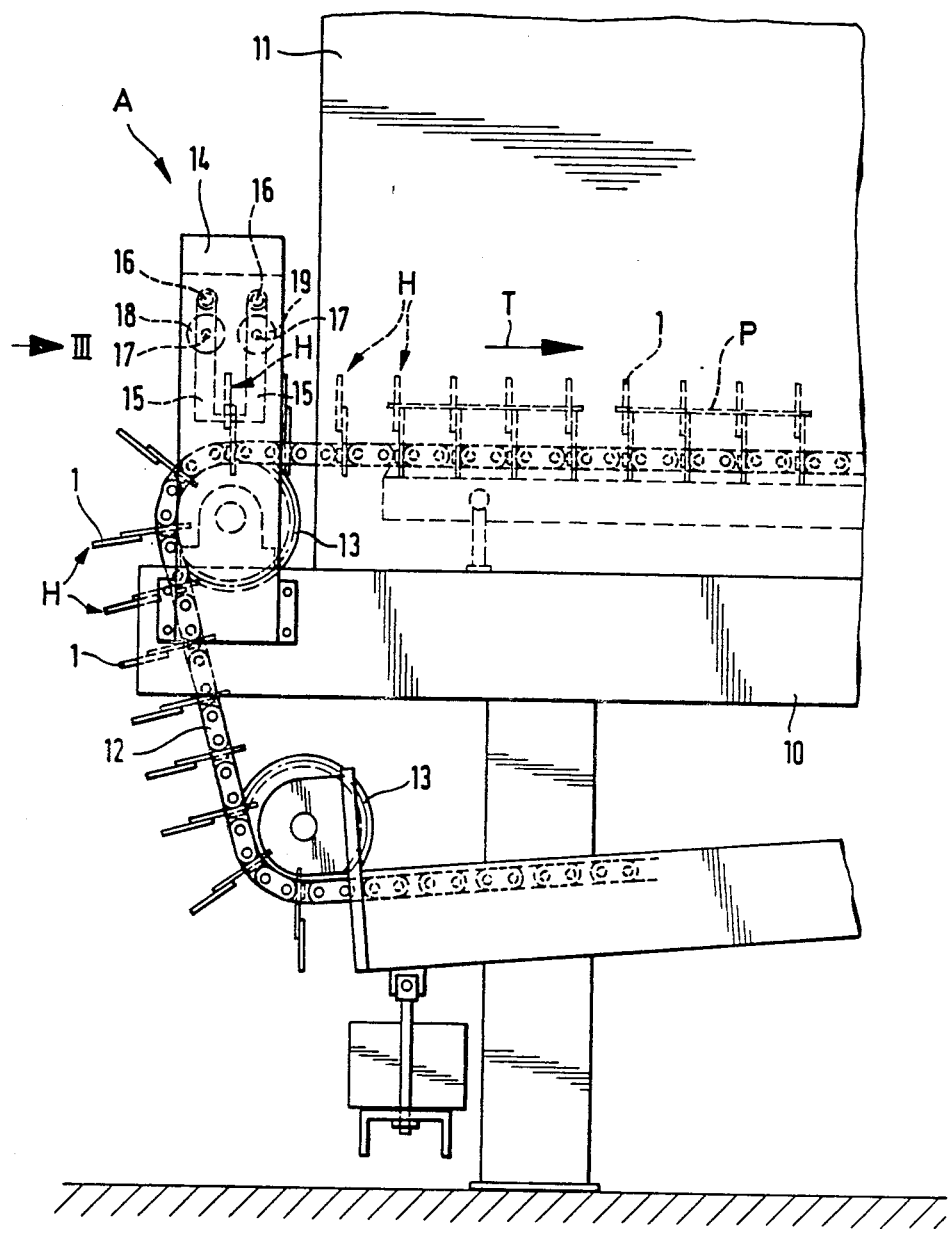
FIG. 2 is a lateral view, taken in the direction indicated by arrows II in FIG. 1, of a region of the embodiment shown in FIG. 1, which region contains the panel-charging station A.
Figure 3:
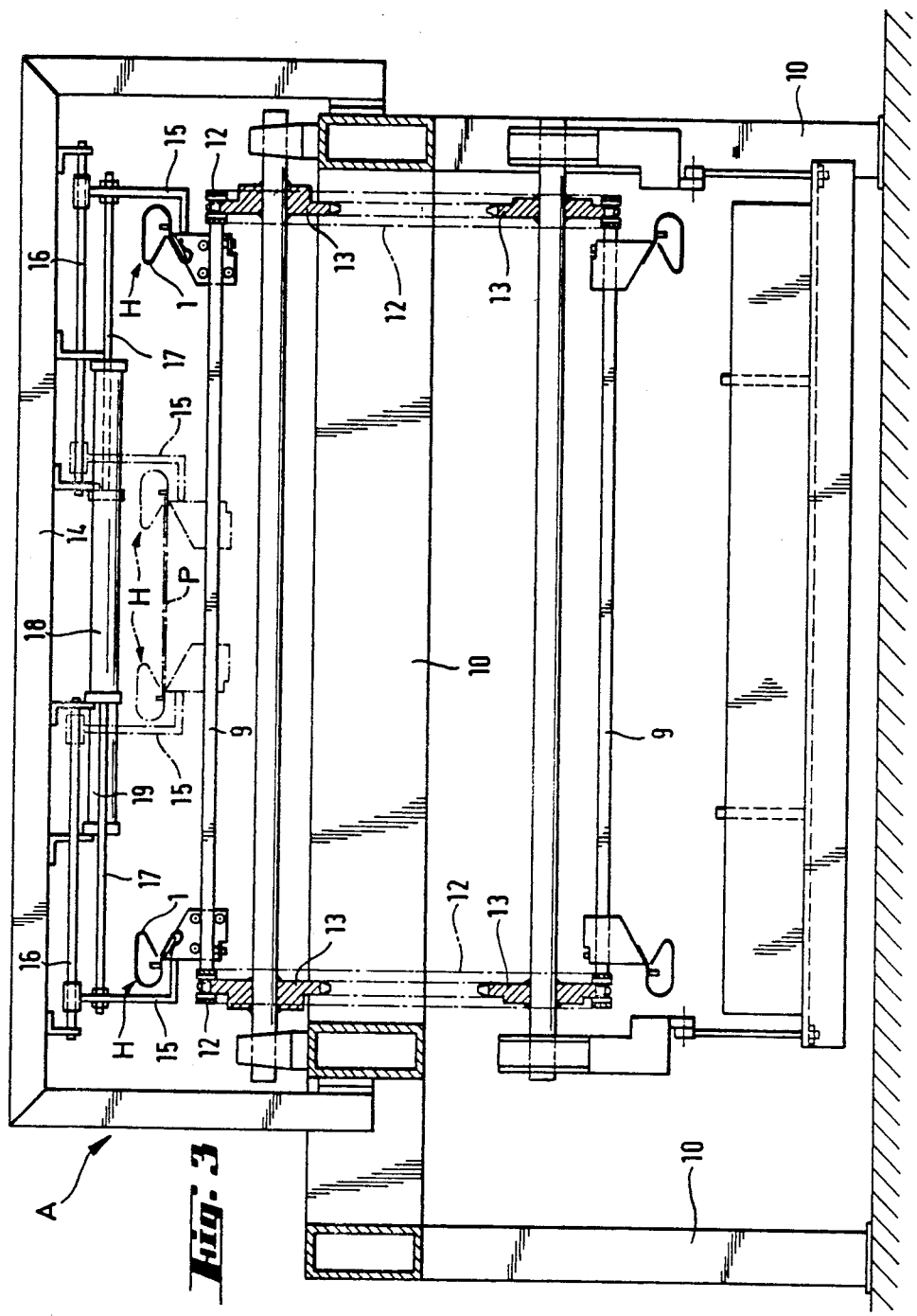
FIG. 3 is a frontal end view of the same embodiment as shown in FIGS. 1 and 2, taken in the direction indicated by an arrow III in FIG. 2.
Figure 4:
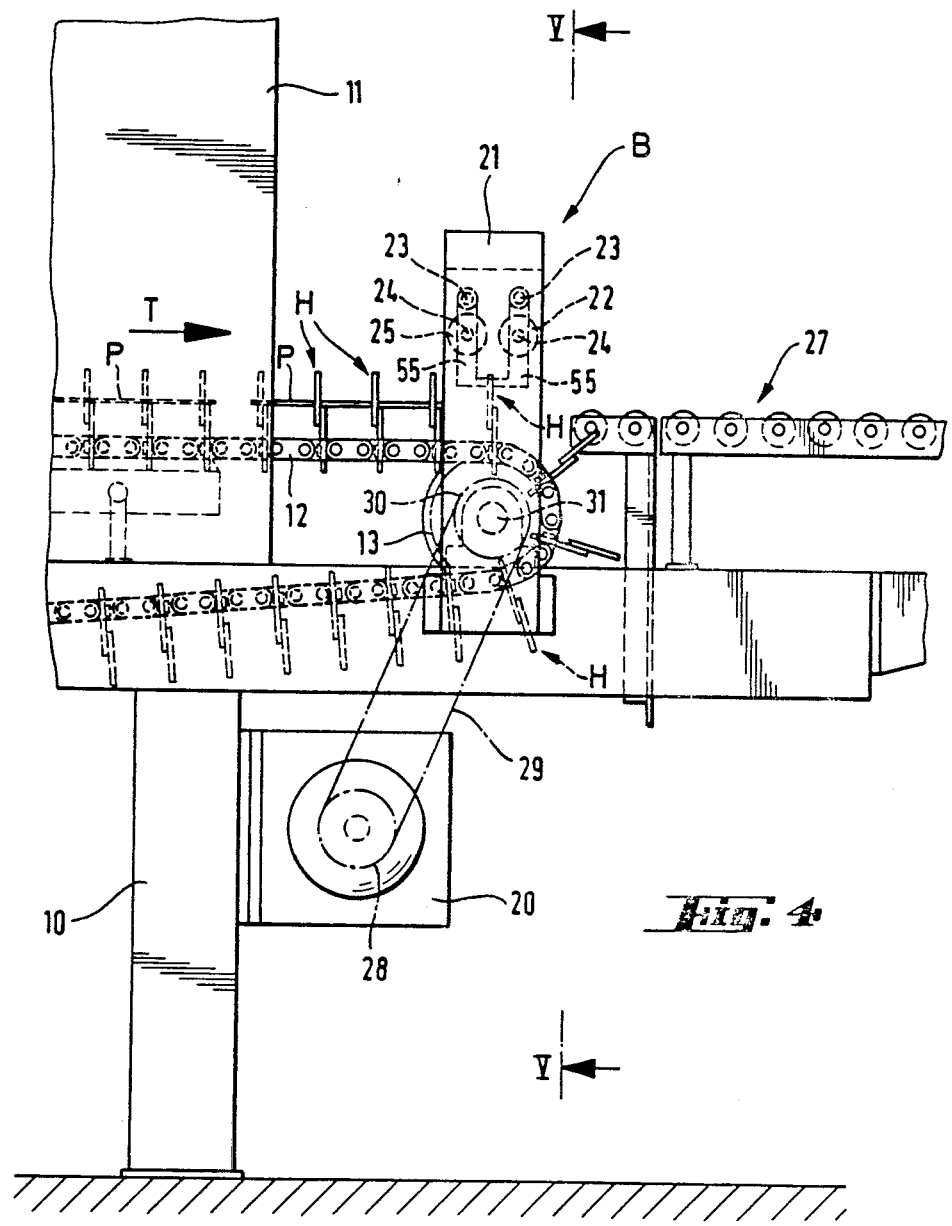
FIG. 4 is a lateral view, taken in the direction indicated by arrows IV in FIG. 1, of a region containing the panel-discharging station B.

As can be seen in FIGS. 2 and 3, the charging station A contains a mechanism for the control of the functioning of the two panel-engaging devices H slidably and brakably arranged, one at the left hand region and the other at the right hand region, of the cross bar 9. This mechanism comprises a frame 14 in which there are mounted two pneumatic cylinders 18 and 19 each containing pistons (not visible) piston rods 17 of which move inward or outward pusher members 15,55 which act, respectively, on the left-hand or right-hand device H in a manner such that these devices are moved inwardly or outwardly along the cross bar 9.

The upper ends of the pusher members 15,55 are fitted with sleeves guided on a guiding rail 16. As can be seen on a larger scale in FIGS. 8A and 10A, which show the pusher member 15 and a central portion of the piston rod 17, the pusher member is of L-shape, the short horizontal L-arm extending parallel with the piston rod 17 and the axis of the cross bar 9. This L-arm bears at its free, inwardly directed end an abutment piece 15a made of shock-absorbing material As shown in dashed outlines in FIG. 3, a panel P is gripped and held during transfer between two panel-engaging devices H, on the left-hand and on the right-hand half of the common cross bar 9, respectively.

In order to grip the panel P the left-hand and right-hand devices H of the pair on the cross bar 9 have been pushed inwardly toward each other on the common cross bar 9 with the aid of their respective pusher members 15. These pusher members act automatically as described further below. In FIG. 3, most of the second cylinder 19 is hidden behind the cylinder 18 while they are shown arranged side-by-side in cross-sectional view in FIG. 2. A portion of the right-hand piston rod 17 and guide rail 16 as well as the right-hand pusher member 15 are also shown in fully drawn outline in terminal end position, and in dashed outline in inwardly displaced panel-gripping position.

Depending on the size of the apparatus, the transverse organs constituted by the cross bars 9 are arranged at distances of from about 20 to 100 mm between the lateral conveyor belts 2 which move them above and past a conveyor table 10 together with the cross bars 9 and the pairs of devices H thereon. The conveyor belts are deflected toward the horizontal reach above the table 10 by means of the deflector rollers 13. Each time, as soon as a cross bar 9 enters in the gap between the two pusher members 15 of the charging station A, the two devices H on that cross bar are pushed by the two pusher members 15 inwardly toward the center of their cross bar 9. The panels P are being held up to the level of the gripping slots S in the left-hand and the right-hand device H, respectively, in a plane parallel to that of the conveyor table 10, by feeding means, e.g. feeding rollers, not shown in the drawings. When the forward portions of the lateral rim regions of a panel P arrive between the two devices H, the pusher members 15 are automatically activated to push the two devices H inwardly so that the lateral panel rims penetrate into the left-hand and right-hand slots S, respectively, and are gripped therein by the two clamping springs 1.

As can be seen from FIGS. 8A and 9, the inward pushing action of the two pusher members 15 is controlled by a light barrier 41/L/42 which is rigidly mounted on the pusher member 15 by means of a support bracket 40. In the embodiment of a panel-engaging device H as shown in FIG. 8A the light ray L passes via a light conductor 43 to a light emitter 41, and the light emitted by the latter passes via a receiver 42 and a light conductor 44 to a computing station (not shown) which in turn controls the pneumatic pusher drive means comprising the cylinders 18 and 19. This control involves arresting the pneumatic drive of the pusher members 15, whenever the forward edge of a panel P interrupts the path of the light ray L, and reversing that drive until the panel-engaging devices H are withdrawn outwardly by a short distance to stretch the panel. The emitter 41 and the receiver 42 of the light barrier 41/L/42 can be displaced parallely, i.e. axially relative to the cross bar, in the directions of the double arrow j←→k, whereby the light barrier can be adjusted, corresponding to the panel thickness and the resistance, dependent thereon, which must be overcome by the clamping spring 1 when being pushed over the panel rim, in a manner such that the panel-inserting movement is terminated immediately prior to the panel rim making contact with the abutment pin 1d, or that the panel abuts with its rim on the pin 1d only with greatly reduced speed.

In the embodiment shown in FIGS. 10A and 11, the light conductor means are replaced by a lower and an upper light-deflecting surface mirror 48 and 49, respectively. These mirrors 48 and 49 are mounted at the same sites which are occupied in FIGS. 8A and 9 by the emitter 41 and receiver 42, respectively; the light-emitter 41 and light-receiver 42 are mounted in the embodiment of FIGS. 10A and 11 on a stationary apparatus part 50. The surface mirrors 48 and 49 are displaceable, for setting and adjustment of the light-barrier L, in the directions indicated by the double arrow j←→k.

In order to save drawing space, the distance between the stationary machine part 50 and the pusher member 15 and the panel-engaging member H in contact therewith, shown in FIG. 10A is kept relatively small. In fact, this distance is considerably larger.

In the above-described manner, the panels P are being fed into the charging station A at the same speed with which the conveyor belt members 12 revolve, the panels are seized in the charging station laterally by the panel-engaging devices H and are then transferred by the members 12 of the belt over the feeding table 10 to a first processing station and on to the discharging station B.

At the end of the transfer path, as the panel-engaging devices H arrive in the discharge station B, they will be automatically opened as will be described below, and the processed panels P, thus released, will be passed for further conveyance to the train of rollers 27. The mechanism in the discharging station B serving for opening the panel-devices H is constructed along similar lines as the pusher-containing mechanism of the charging station A, for moving the devices H inward. In the discharging station B, the devices H are pushed apart in outward direction by separating members 55 which draw them off the panels P and move them back to their terminal positions at the ends of the cross bar 9. In doing so the separating members 55 which are of similar L-shaped construction as the pusher members 15, contact with their shorter horizontal L-arms the upper region of the upper V-leg 1a of the clamping spring 1 in each of the two devices H shown in dashed lines in FIG. 3, whereby the spring leg 1a of each device H is first resiliently bent upward and outwardly, thereby setting free the circuit panel P, whereupon, upon further pressure of the separating member 55, the two devices H are pushed outwardly to their terminal positions on their common cross bar 9, as shown in fully-drawn outline in FIG. 3. The action of each separating member 55 for opening the panel-engaging device H and withdrawing it from a panel is indicated in each of FIGS. 8A and 10A by an arrow VB.

The drive of the separating members 55 is effected by pneumatic cylinders 22, for the left-hand panel-engaging device H (seen in the transfer direction, i.e. on the right-hand side in FIG. 5) and 25 for the right-hand device H. The separating pusher member 55 is connected to a piston rod 24 of the piston (not visible) in the cylinder 22 or the cylinder 25, respectively and is guided by means of a sleeve at the upper end of its upright L-arm on a guide rail 23 fastened on the frame 21.

In their rest position the pair of separating members 55 is ready for engaging the next pair of devices H bringing a panel into the discharging, and awaits their arrival in the central region above the cross bar 9 as indicated in phantom lines in FIG. 5.

As has been explained in detail hereinbefore in connection with FIGS. 6A and 7, 8A and 9, and 10A and 11, respectively, the carrier bodies 2 of the panel-engaging devices H are displaceably and brakedly mounted in pairs on the cross bars 9, while being inwardly and clockwise tiltable against the bias of a restoring spring F. The pusher members 15 and separating members 55 act on the devices H at levels above the swivelling axis about which the carrier body 2 tilts inward and downward. The action of the pusher members 15 is indicated in FIGS. 6A, 8A and 10A by an arrow VA. The entire inwardly acting mechanism is so adjusted or adjustable that the force of the tilt-biassing and restoring spring F is, on the one hand, smaller than the braking force tending to arrest the panel-engaging device H on the cross bar 9, and that, on the other hand, this force is greater than the effect of the weight of the panel P to be conveyed. Due to this adjustment, and to the point of attack of the pushing members 15, when the panel-engaging devices are being pushed inwardly toward each other, by the pusher members 15, the devices H are tilted slightly inwardly and with their outward parts of the clamping spring 1 and carrier body 2 upwardly, clockwise, (tilting arrow R) with compression of the spring F.

When the opposite panel edges have been gripped by the pair of devices H on the first cross bar 9 passing through the charging station A, and as each panel edge abuts against the abutment pin 1d of the respective clamping pin 1, and the reverse movement of the pusher members 15 in outward direction begins, the panel-engaging devices H have the tendency, under the action of the restoring spring F, to swivel back counter-clockwise to their initial horizontal position on the cross bar 9. Thereby, they will exert a transverse pull on the panel P acting against an undesirable slag in the central panel region and stretching the entire panl horizontally. As several pairs of panel-engaging devices H act simultaneously on both lateral rim zones of the panel P, the transverse pull or tensioning force thus applied to the panel can be relatively large, the number of pairs gripping a panel depending on the length of the latter at a given spacing of the transverse organs.

Another advantage results from the pressure of the panel edge abutting against the V-leg 1a and the latter being already tilted; the angle of impact between the panel edge and the upper V-leg 1a is being made smaller and the lifting of the V-leg by the panel edge occurs smoothly and not abruptly as would be the case if the upper V-leg 1a were not capable of tilting. This cushioning of the contact between the panel edge and the outside flank of the upper V-leg 1a is particularly advantageous when the panel edge is slightly bent upwardly which is the case when the middle region of the panel sags slightly downwardly under the weight of the panel itself, while arriving at the charging station A.

The tilting arc traveled by the slot S is a multiple of the arc traveled by the upper rim of the cylinder 7, when it is that upper rim that impinges on the underside face of the carrier body 2 or of the lower sliding runner 30b (FIGS. 3 or 8A, respectively). This is assured if the cylinder 7 protrudes sufficiently upwardly out of the upper surface of the angle iron 5 or the bottom face of the groove 37 in the lower portion of the carrier body 2. Alternatively, in the latter case, the outward bottom region of the sliding runner 30b can also be slanted upwardly to prevent the outward edge of the said bottom of the groove 37 to abut against the underside of the runner 30b before the rim of the cylinder 7 can do so (slanted underside zone 38 shown by a phantom line in FIG. 10A).

The inward tilting of the panel-engaging devices H takes place automatically, as long as the contact level between a pusher member 15 and the upper region of the carrier body 2 of the respective device H is high enough above the level of the swivel axis E that the braking forces of the braking element, in the embodiments shown in FIGS. 6A to 11 the restoring spring F, or optionally another braking organ separate from the restoring spring, acting on the carrier body 2 are stronger than the inward pushing forces which are first applied to tilting against the bias of the restoring spring. Only when such tilting has been effected to its limit, will the total of pushing forces be applied to overcome the braking forces. In FIG. 6A, the arrow VA indicates the level at which the pusher member engages the carrier body 2. When, however, as in the embodiments of FIGS. 8A to 11, the pusher member 15 engages the carrier body 2 only slightly above the level of the swivel axis E, tilting of the device H can be assured by providing a cam piece 45 on the outward end face of the carrier body 2, which cam piece may have a curved underside which causes the contact-making tip of the pusher member 15 to tilt the entire panel-engaging device in the direction of the arrow R; when stopping and reversing the movement of the pusher member 15 upon a panel edge penetrating the light barrier 41/L/42 or 48/L/49 (FIGS. 8A or 10A) so that the pusher member 15 becomes disengaged from the cam piece 45, the restoring spring F can return the panel-engaging device H to its untilted position.

A cam piece 45 is not necessary when the level of contact between the pusher member 15 and the carrier body 2 is as shown in FIGS. 8A and 10A, if the restoring unit 33 is provided in the upper portion of the cage 30, so as to urge the runners 30a and 30b with braking against the cross bar 9, while providing for the play e between the upper face of the upper runner 30a and the wall portion of the cage 30 which forms the bottom of the upper groove 36. In this case, the swivel axis E is located diametrically opposite the site thereof shown in FIGS. 8 and 10A. The tilting force vector of the pushing force of the pusher member 15 should then be larger than the restoring force of the restoring spring F, and tilting should be assured without a cam piece 45. However, the location of the restoring unit 33 in the upper portion of the cage 30 may meet with certain difficulties as to available space. Therefore, the arrangement as shown in FIGS. 8A and 10A is preferred.

We claim:

1. An apparatus for conveying in a longitudinal transfer direction panels having opposite lateral rims extending substantially in said longitudinal direction, said apparatus comprising two endless conveyor belt members revolving spaced from, and in parallel with, each other in said longitudinal transfer direction, in an endless path comprising an upper horizontally extending reach;

a panel-charging station;

a discharging station; and a random number of working stations therebetween, all said stations being in said upper reach;

a plurality of transverse organs extending across said two endless conveyor belt members at an angle to said longitudinal direction, said transverse organs being spaced from each other in sequence at determined intervals, panel-engaging devices associated with said transverse organs and being adapted for gripping successively said rims of said panels during passage through said charging station, thus holding the gripped panels while transferring them through any working stations present and onward, through said upper reach, to said discharging station, and for releasing said panels while passing through said discharging station;

each of said transverse organs carrying two of said panel-engaging devices facing each other in mirror-symmetrical positions and being displaceable on said transverse organ in inward direction toward, and in outward direction away from each other, the distance on said transverse organ between said panel-engaging devices being free of means for supporting the panel;

feeding means for feeding panels to said charging station to be transferred, approaching means associated with said charging station and adapted for displacing said panel-engaging devices in inward direction, as a transverse organ carrying a pair thereof reaches said charging station, to bring said panel-engaging devices, of said pair, into position capable of gripping a panel at opposite lateral rims thereof in said charging station, separating means associated with said discharging station and adapted for displacing said panel-engaging devices in outward direction, as a transverse organ carrying a pair thereof arrives at said discharging station, while simultaneously acting upon said devices to release any panel gripped therebetween, each of said panel-engaging devices of a pair thereof, comprising braking means adapted for increasing the braking force for braking displacement of said devices on the common transverse organ thereof up to completely arresting said devices in any position thereon substantially solely by said braking force.

2. The apparatus of claim 1, wherein each of said panel-engaging devices comprises a restoring spring and is tiltable in inward direction about a swivel axis, against the bias of said restoring spring at the time of being brought into contact with a panel rim by said approaching means, said restoring spring being adapted for returning the tilted panel-engaging device to untilted position, whereby a straightening pull, transverse to said longitudinal direction is exerted on a panel gripped between a pair of said devices on a common transverse organ.

3. The apparatus of claim 2, wherein said approaching means comprise a set of pusher members adapted for pushing a pair of said panel-engaging devices on a common transverse organ inward into position for gripping a panel, and first drive means stationary in said charging station and adapted for actuating said set of pusher members, and said separating means comprises a set of separating members adapted for pushing a pair of said panel-engaging devices on a common transverse organ outward while at the same time acting upon said devices to open and release a panel gripped by said devices, and second drive means stationary in said discharging station and adapted for actuating said set of separating members, said first and second drive means being arranged above the revolving path of said panel-engaging devices, in said upper reach.

4. The apparatus of claim 3, wherein said set of pusher members at said charging station is adapted for engaging pairs of panel-engaging devices when entering said upper reach on the respective transverse organs carrying said pairs, above the swivel axis of each such device, while the force of said restoring spring in each device is smaller than the braking forces tending to hold each such pair of devices in position on the respective transverse organ, and while the force of said restoring spring is greater than the displacing force exercized by the weight of a panel, gripped by said pair of devices, on said pair.

5. The apparatus of claim 3, wherein each panel-engaging device of a pair thereof on a common transverse organ comprises a clamping spring, and each clamping spring comprises two clamping legs, the configuration of whose cross section, taken in a plane normal to said longitudinal direction, represents a V, turned by 90°, whose pointed end faces outwardly and whose opposite, open end faces inwardly, across toward the V formed mirror-symmetrically by the V-forming legs of the clamping spring in the opposite device of said pair; one of said V-legs in each clamping spring being the upper and the other the lower one, said upper V-leg having a free end urged with bias inherent in said clamping spring against an upper zone of said lower V-leg, and being adapted for being lifted off the lower V-leg against said inherent bias with formation of a slot between said two V-legs, said slot being entered by the rim of a panel during inward displacement of said devices of said pair into engagement with said panel.

6. The apparatus of claim 5, wherein a separating member of said separating set at said discharging station is adapted to engage the respective device by contacting the upper V-leg of said clamping spring thereof above a panel being gripped by said device, and, when beginning to push said device in outward direction, opening said device by lifting said upper V-leg off the lower V-leg against said inherent bias, to a degree depending on the difference between the pushing force exercized by said separating member on said device and the braking forces that tend to hold said device in position on the common transverse organ bearting said device, whereby said panel is released, and said separating set pushes the pair of said devices toward terminal positions on said common transverse organ.

7. The apparatus of claim 2, wherein said restoring spring urges said panel-engaging device with bias against said transverse organ, thereby acting as a braking element on said device, and wherein said device is mounted on said transverse organ with enough play enabling tilting of said device inward by said approaching means lifting an outward-facing region of said device upwardly off said transverse organ as said play permits, against the bias of said restoring spring, said restoring spring returning said device to untilted position when said lifting action of said approaching means ceases.

8. The apparatus of claim 5, wherein the distance between the swivel axis of said panel-engaging device from a transfer plane in which said panel gripped by said pair of devices moves, and the distance of said swivel axis from the lifting end of said restoring spring constitute a lever system such, and said restoring spring is arranged in a position such in the respective device, that the tilting amplitude of said slot about said swivel axis is larger than, and up to a multiple of, the stroke being carried out by said restoring spring when restoring said panel-engaging device to untilted position.

9. The apparatus of claim 5, wherein each of said approaching means comprises light barriers, one for each pusher member thereof, said light barriers being adapted for scanning the depth of penetration of a panel into said slot between said upper and lower V-legs of said clamping spring, and means adapted for stopping and for reversing said first drive means, as soon as said light barrier detects a panel rim having penetrated said slot by a determined depth.

10. In an apparatus for conveying in a longitudinal transfer direction panels having opposite lateral rims extending substantially in said longitudinal direction, said apparatus comprising two endless conveyor belt members revolving spaced from, and in parallel with, each other; in said longitudinal transfer direction, in an endless path comprising an upper horizontally extending reach;

a panel-charging station;

a discharging station; and a random number of working stations therebetween, all said stations being in said upper reach;

a plurality of transverse organs extending across said two endless conveyor belt members at an angle to said longitudinal direction;

the improvement comprising panel-engaging devices, arranged in pairs, each of said transverse organs carrying two of said panel-engaging devices facing each other in mirror-symmetrical positions and being displaceable on said transverse organ in inward direction toward, and in outward direction away from, each other;

each of said panel-engaging devices comprising a clamping spring comprising two clamping legs whose cross-sectional configuration, in a plane normal to said longitudinal direction, is a V, turned about an angle of 90°, having a pointed end and an opposite open end, said two V-legs being in free contact with each other at said pointed V-end, an upper one of said two V-legs being urged with inherent spring bias against an upper zone of the other V-legs, being the lower one, said upper V-leg being adapted to be lifted off said lower V-leg against said inherent bias by a force acting against said upper V-leg in a substantially horizontal direction through said open V-end toward said pointed V-end and forming a slot between said two V-legs adapted for the introduction of the rim of a panel to be clampingly gripped by said two V-legs, a carrier body having a top region and comprising recess means for engaging an upper and a lower face of said transverse organ with play in a horizontally displaceable manner relative thereto, said lower V-leg of said clamping spring comprising a prolongation firmly mounted in said upper region of said carrier body;

adjustable restoring spring means lodged in said carrier body and adapted for engaging brakingly said lower face of said transverse organ, said panel-engaging devices being tiltable in an inward direction about a swivel axis against the bias of said restoring spring at the time of being brought into contact with a panel rim, said restoring spring being adapted for returning the tilted panel-engaging device to untilted position, whereby a straightening pull is exerted on the panel gripped between a pair of said devices on a common transverse organ; and means for displacing said panel-engaging devices on said transverse organ in inward and outward directions.

11. The apparatus of claim 10, wherein said carrier body comprises movable supporting means adapted for supporting said carrier body on said transverse organ, said supporting means being a pair of braking and sliding runners, and said recess means comprising a first groove located above and a second groove located below, and opening into said recess means; one of said runners being lodged in said first groove in a position such as to rest upon said upper face of said transverse organ and the other runner being lodged in said second groove in a position such as to rest with play underneath the lower face of said transverse organ, said restoring spring means being mounted in said carrier body in a manner such as to penetrate into said second groove and thereby being adapted for exerting pressure on said runner therein urging the same into braking contact with the lower face of said transverse organ while maintaining play between said runner in said second groove and the bottom of said second groove, and thereby urging simultaneously said runner in said first groove into braking contact with the upper face of said transverse organ, said play enabling tilting of said device inward by a force applied to said carrier body on the side thereof facing outwardly, and at a level from said upper face of said transverse organ in said recess means, upward.

12. The improvement of claim 11, wherein said tilting of said panel-engaging device comprises lifting an outward region of said device upwardly off said transverse organ, against the bias of said restoring spring, said restoring spring urging said device with braking against said transverse organ and simultaneously restoring said device to untilted position when said tilting force ceases to be applied.

13. The improvement of claim 10, wherein said carrier body comprises movable supporting means adapted for supporting said carrier body on said transverse organ and being rotatable members of the roller and wheel type.

* * * * *